United States Patent
Leobandung et al.

(10) Patent No.: US 9,859,685 B2
(45) Date of Patent: Jan. 2, 2018

(54) SMALL APERTURE FORMATION FOR FACILITATING OPTOELECTRONIC DEVICE INTEGRATION WITH DEFECTIVE SEMICONDUCTOR MATERIALS

(71) Applicant: International Business Machines Corporation, Armonk, NY (US)

(72) Inventors: Effendi Leobandung, Stormville, NY (US); Ning Li, White Plains, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/966,850

(22) Filed: Dec. 11, 2015

(65) Prior Publication Data
US 2017/0170632 A1    Jun. 15, 2017

(51) Int. Cl.
H01S 5/18        (2006.01)
H01S 5/183       (2006.01)
H01L 27/092      (2006.01)
H01S 5/10        (2006.01)
H01S 5/187       (2006.01)
H01S 5/22        (2006.01)

(52) U.S. Cl.
CPC ............ H01S 5/183 (2013.01); H01L 27/092 (2013.01); H01S 5/1042 (2013.01); H01S 5/187 (2013.01); H01S 5/18311 (2013.01); H01S 5/22 (2013.01)

(58) Field of Classification Search
CPC .... H01S 5/183; H01S 5/1042; H01S 5/18311; H01S 5/187; H01S 5/22; H01L 27/092
See application file for complete search history.

(56) References Cited

U.S. PATENT DOCUMENTS

| | | | |
|---|---|---|---|
| 5,859,864 A | 1/1999 | Jewell | |
| 6,815,726 B2* | 11/2004 | Ishida | H01L 21/0237 257/103 |
| 6,839,370 B2 | 1/2005 | Peters et al. | |
| 7,020,172 B2 | 3/2006 | Naone et al. | |
| 7,101,444 B2 | 9/2006 | Shchukin et al. | |
| 7,180,100 B2 | 2/2007 | Takahashi et al. | |
| 7,582,498 B2 | 9/2009 | D'Evelyn et al. | |
| 7,817,691 B2 | 10/2010 | Suzuki et al. | |
| 8,451,706 B2 | 5/2013 | Kondo | |
| 2008/0232414 A1* | 9/2008 | Masui | H01S 5/18311 372/44.01 |

(Continued)

OTHER PUBLICATIONS

"Design and Analysis of New Structure for High-Performance Low-Index Defect-Based Photonic Lattice VCSEL" Monfared, Y.M.; Ahmadi, V. Lightwave Technology, Journal of Year: 2012, vol. 30, Issue: 1, pp. 103-109, DOI: 10.1109/JLT.2011.2175478.

(Continued)

*Primary Examiner* — Armando Rodriguez
(74) *Attorney, Agent, or Firm* — Louis Percello

(57) ABSTRACT

In one example, a device includes a layered semiconductor material having material defects formed therein and an optoelectronic device formed in the layered semiconductor material. The optoelectronic device includes an active region comprising an aperture formed through the layered semiconductor material. The aperture is formed in a manner that avoids intersection with the material defects.

13 Claims, 10 Drawing Sheets

(56) References Cited

U.S. PATENT DOCUMENTS

2016/0103278 A1* 4/2016 Cheng .................... H01S 5/026
385/14

OTHER PUBLICATIONS

"Nano-aperture VCSELs" Koyama, F. Lasers and Electro-Optics Society, 2006. LEOS 2006. 19th Annual Meeting of the IEEE Year: 2006, pp. 442-443, DOI: 10.1109/LEOS.2006.279205.

"An all-epitaxial InP-based 1.55 μm VCSEL process with defect-free AlxOy/GaAs distributed Bragg reflector mirrors" Gebretsadik, H.; Kamath, K.; Bhattacharya, P.; Caneau, C.; Bhat, R. Indium Phosphide and Related Materials, 1998 International Conference on Year: 1998, pp. 307-309, DOI: 10.1109/ICIPRM.1998.712464.

"A Single-Fundamental-Mode Photonic Crystal Vertical Cavity Surface Emitting Laser with Seven-point Defect" Zhou Kang, Xu Chen, Xie Yi-Yang, Zhao Zhen-Bo, Liu-Fa, Liu Ying-Ming, Wang Bao-Qiang, Shen Guang-Di Journal of Physics: Conference Series 276 (2011) 012112 doi:10.1088/1742-6596/276/1/012112.

* cited by examiner

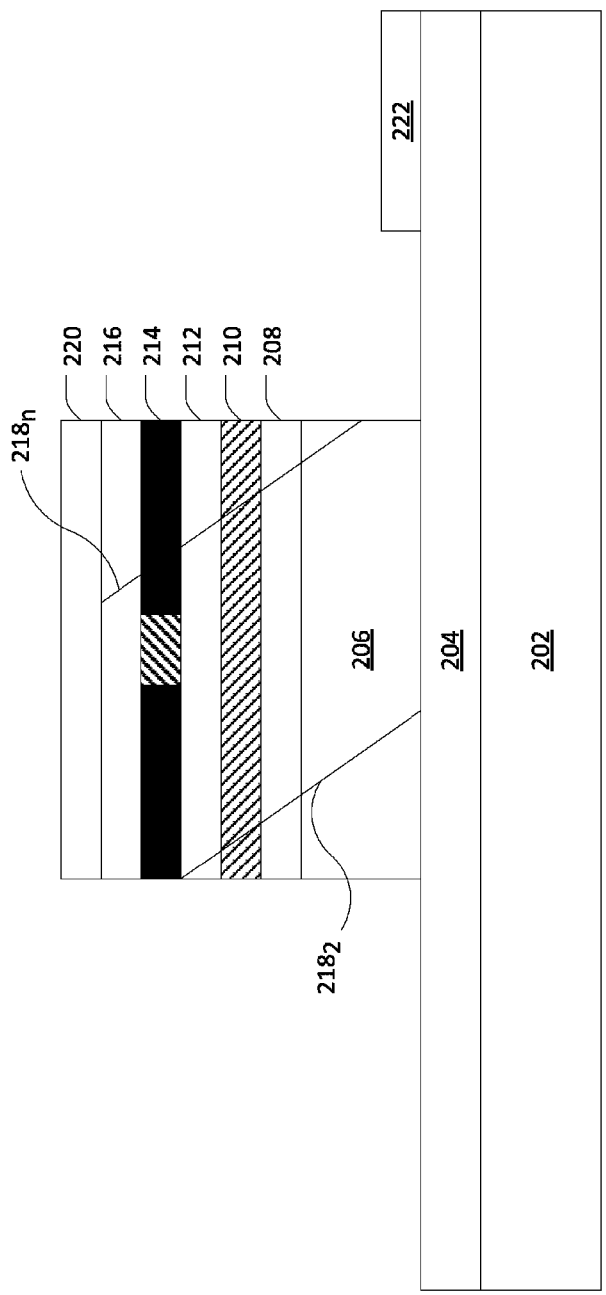

SMALL APERTURE FORMATION FOR FACILITATING OPTOELECTRONIC DEVICE INTEGRATION WITH DEFECTIVE SEMICONDUCTOR MATERIALS

FIELD OF THE DISCLOSURE

The present disclosure relates generally to optoelectronic devices and relates more specifically to optoelectronic device integration with defective semiconductor materials.

BACKGROUND OF THE DISCLOSURE

Optoelectronic devices such as lasers, detectors, modulators, and the like may be integrated with semiconductor structures such as complementary metal oxide semiconductor (CMOS) circuits. However, material defects, such as threading dislocations introduced by the lattice mismatch between layers of semiconductor materials, can dramatically reduce the usable area in which a reliable optoelectronic device can be fabricated.

SUMMARY OF THE DISCLOSURE

In one example, a device includes a layered semiconductor material having material defects formed therein and an optoelectronic device formed in the layered semiconductor material. The optoelectronic device includes an active region comprising an aperture formed through the layered semiconductor material. The aperture is formed in a manner that avoids intersection with the material defects.

In another example, a device includes a complementary metal oxide semiconductor circuit region and a photonics region coupled to the complementary metal oxide semiconductor circuit region by a series of conductive lines and vias. The complementary metal oxide semiconductor circuit region includes a semiconductor substrate, a p-type field effect transistor fabricated upon the substrate, and an n-type field effect transistor fabricated upon the substrate. The photonics region includes a layered semiconductor material having material defects formed therein and an optoelectronic device formed in the layered semiconductor material. The optoelectronic device includes an active region comprising an aperture formed through the layered semiconductor material. The aperture is formed in a manner that avoids intersection with the material defects.

In another example, a method includes providing a layered semiconductor material, wherein the layered semiconductor material includes material defects forms therein. An aperture is formed in the layered semiconductor material, wherein the aperture avoids intersection with the material defects. An active region of an optoelectronic device is then formed in the aperture.

BRIEF DESCRIPTION OF THE DRAWINGS

The teachings of the present disclosure can be readily understood by considering the following detailed description in conjunction with the accompanying drawings, in which:

FIG. 2 illustrates a cross sectional view of another semiconductor structure during one stage of another fabrication process performed according to examples of the present disclosure;

To facilitate understanding, identical reference numerals have been used, where possible, to designate identical elements that are common to the Figures.

DETAILED DESCRIPTION

In one example, a method and apparatus for forming small apertures for facilitating optoelectronic device integration with defective semiconductor materials is disclosed. Within the context of the present invention, a "defective" semiconductor material or structure is understood to be a semiconductor material or structure that contains material defects, such as the types of defects that are introduced when other semiconductor materials are grown on silicon. For instance, lattice mismatch between layers of two different semiconductor materials can cause threading dislocations. These and other types of defects can dramatically reduce the usable area in which a reliable optoelectronic device can be fabricated.

Examples of the present disclosure form small apertures in layered semiconductor materials or structures for the confinement of current and electron-photon conversion (i.e., the "active region" of an optoelectronic device). These apertures are formed in regions of the semiconductor structure that are free or nearly free of material defects, making them suitable areas for the integration of optoelectronic devices such as lasers, detectors, modulators, and the like. In one example, the sizes of the apertures are controlled via lateral oxidation and/or material regrowth during fabrication of the semiconductor structure.

Figure 1A:
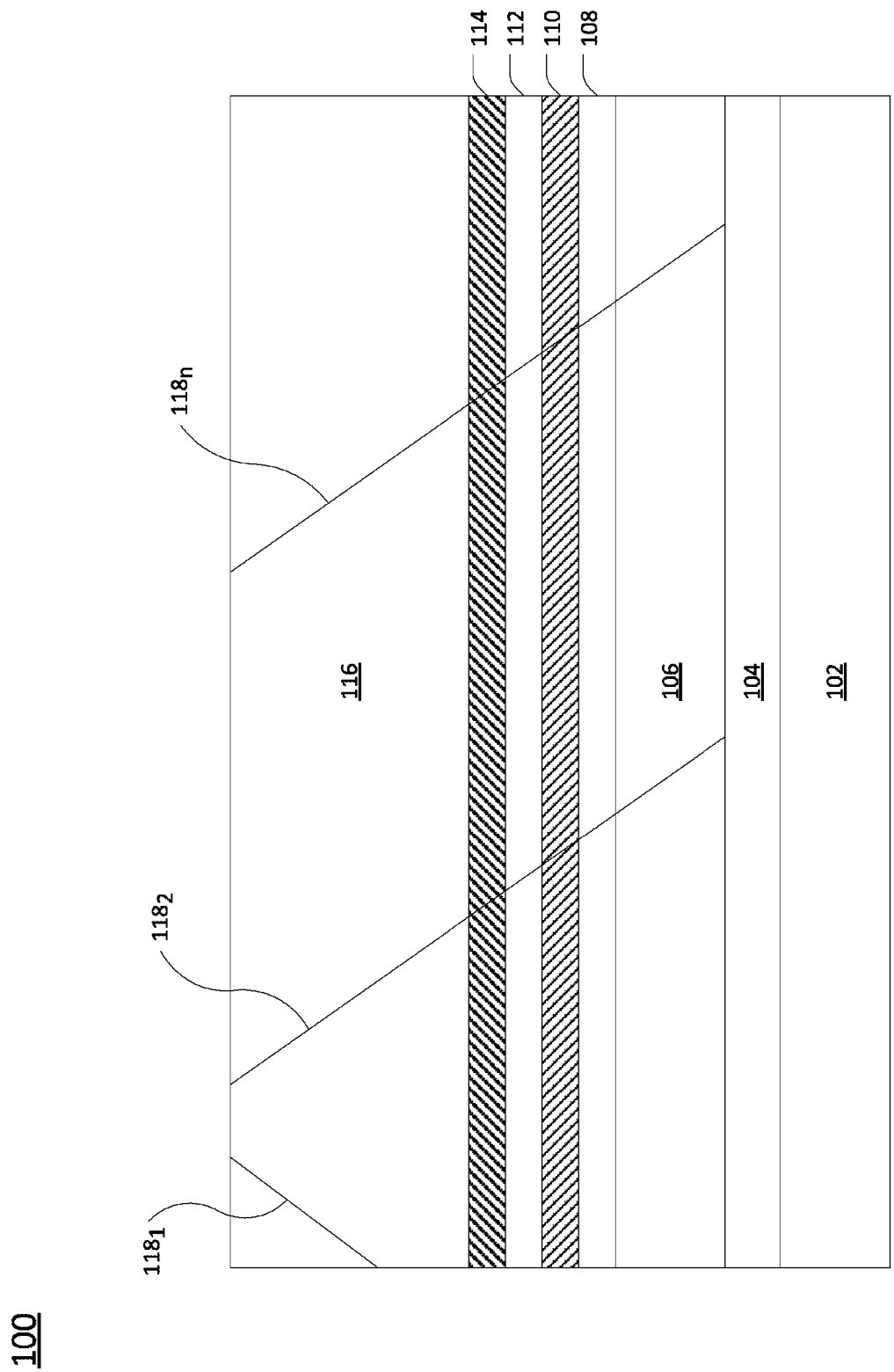
FIGS. 1A-1C illustrate cross sectional views of a semiconductor structure during various stages of a fabrication process performed according to examples of the present disclosure.
Figure 1B:
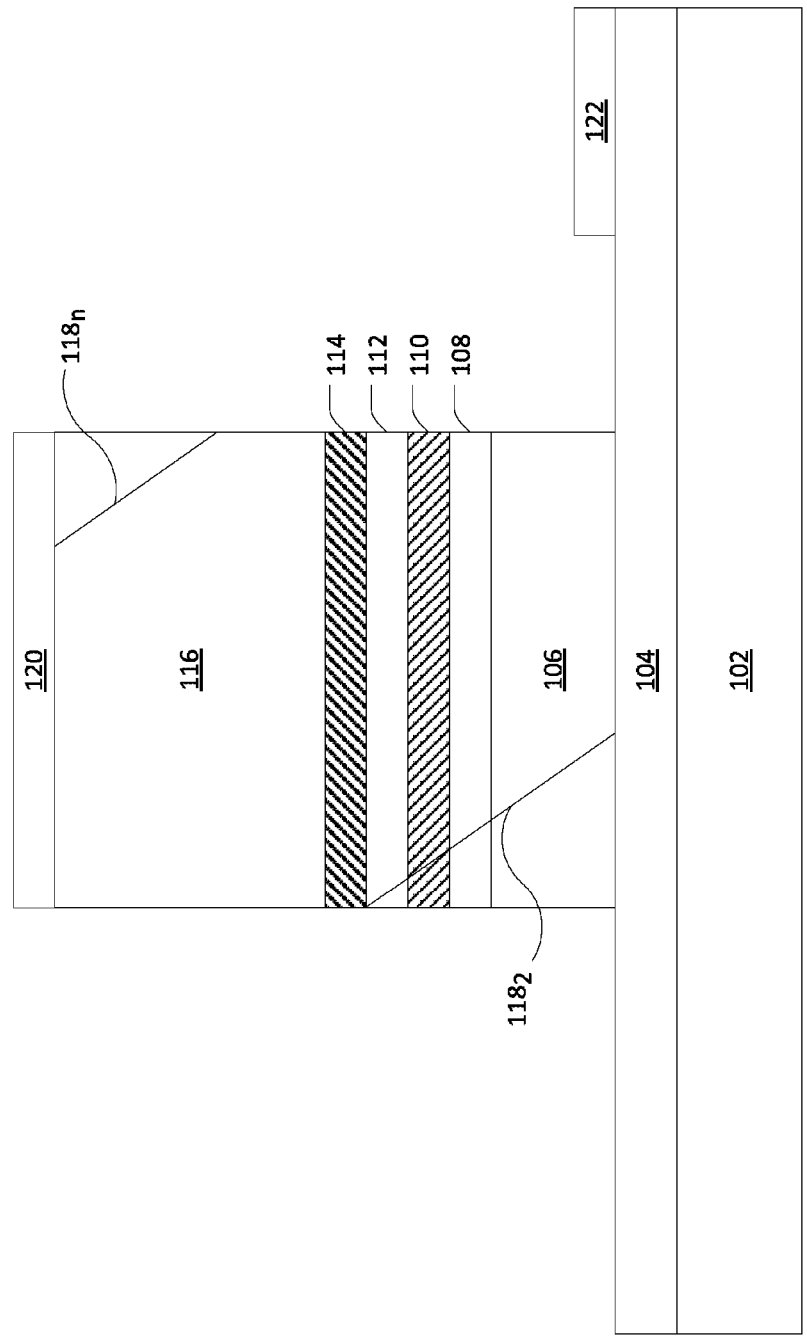
Figure 1C:
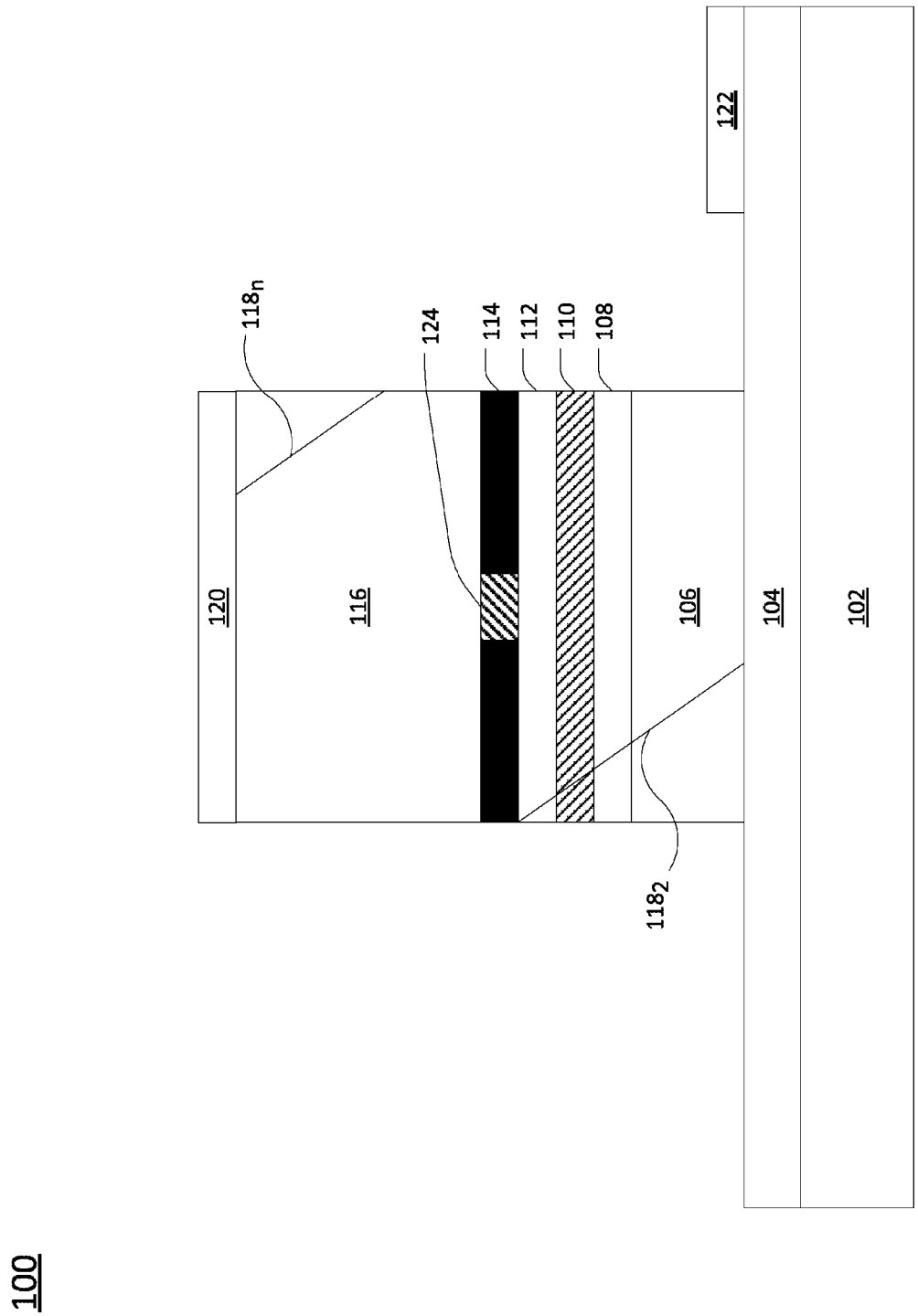

FIGS. 1A-1C illustrate cross sectional views of a semiconductor structure 100 during various stages of a fabrication process performed according to examples of the present disclosure. As such, when viewed in sequence, FIGS. 1A-1C also serve as a flow diagram for the fabrication process.

FIG. 1A in particular illustrates the semiconductor structure 100 during an intermediate step of the fabrication, process, i.e., after several fabrication steps have already been performed. These previous fabrication steps include known processes that are, for the sake of clarity, not described in detail. Thus, the semiconductor device 100 as illustrated in FIG. 1A includes a semiconductor substrate 102, formed, for example, from silicon or another lattice mismatched material. A buffer layer 104 is deposited on the substrate 102, and may comprise a material such as gallium arsenide, germanium, indium phosphate, or gallium nitride. A first cladding layer 106 is deposited on the buffer layer 104, and may comprise a material such as gallium arsenide, aluminum gallium arsenide, indium phosphate, gallium nitride, or aluminum gallium nitride.

A quantum well emitter is formed on the first cladding layer 106 and comprises three layers: a first layer 108 of a wide bandgap material (e.g., aluminum arsenide or gallium nitride), a semiconductor layer 110 formed on the first layer of the wide bandgap material (and comprising, for example, gallium arsenide or indium gallium nitride), and a second layer 112 of the wide bandgap material formed on the semiconductor layer 110. Thus, the semiconductor layer 110 is effectively sandwiched between the first and second layers 108 and 112 of the wide bandgap material. Within the context of the present invention, a "wide bandgap material" is understood to be a material having a wider bandgap than the material that makes up the semiconductor layer 110.

A sacrificial layer 114 is deposited on the quantum well emitter, and in one example is more particularly is deposited on the second layer 112 of the wide bandgap material. The sacrificial layer 114 may include, for example, aluminum arsenide or aluminum gallium arsenide with a high aluminum concentration (e.g., a higher concentration of aluminum relative to the other elements). The sacrificial layer 114 may be deposited to a thickness in a range of approximately ten to one hundred nanometers. A second cladding layer 116 is deposited on the sacrificial layer 114.

As illustrated, lattice mismatch between some of the materials forming the semiconductor structure 100 cause the formation of one or more threading dislocations $118_1$-$118_n$ (hereinafter collectively referred to as "threading dislocations 118") in the semiconductor structure 100. These threading dislocations 118 can reduce the area in the semiconductor structure 100 that is suitable for the integration of optoelectronic devices.

FIGS. 1B-1C illustrate further steps of the fabrication process that mitigate the effect of the threading dislocations 118. In particular, as shown in FIG. 1B, a portion of the semiconductor structure 100 is etched (e.g., via reactive ion etching or anisotropic wet chemical etching) to form a mesa. In particular, portions of the semiconductor structure (i.e., first cladding layer 106, first layer 108 of wide bandgap material, semiconductor layer 110, second layer 112 of wide bandgap material, sacrificial layer 114, and second cladding layer 116) are etched down to the buffer layer 104. In one example, the mesa is etched as small as possible in order to avoid or minimize intersection with the threading dislocations 118. A first metallic contact 120 is formed on the remaining portion of the second cladding layer 116, and a second metallic contact 122 is formed on a portion of the buffer layer 104.

As shown in FIG. 1C, the semiconductor structure 100 is next oxidized. Oxidation of the sacrificial layer 114 results in a majority of the sacrificial layer 114 forming an insulating material. For instance, if the sacrificial layer 114 contained aluminum, oxidation of the sacrificial layer 114 might result in the formation of aluminum oxide. However, a small aperture 124 remains in the oxidized sacrificial layer 114, and the size of the aperture 124 is controlled to be small enough to fit within a defect-free region of the semiconductor structure 100 (e.g., a region that is free of or does not intersect with any threading dislocations 118).

Thus, the aperture 124 confines the current and electron-photon conversion processes of the semiconductor structure 100 to a small, defect-free area. The aperture 124 may therefore form the optical output (i.e., light emitting area) of, for example, an edge emitting laser. This allows a reliable laser to be built upon a semiconductor structure 100 that includes defects that might otherwise inhibit operation of the laser.

FIG. 2 illustrates a cross sectional view of another semiconductor structure 200 during one stage of another fabrication process performed according to examples of the present disclosure. In particular, the semiconductor structure 200 of FIG. 2 is substantially similar to the semiconductor structure 100 of FIG. 1 and is fabricated in a very similar manner.

FIG. 2 illustrates the semiconductor structure 200 during an intermediate step of the fabrication, process, i.e., after several fabrication steps have already been performed. These previous fabrication steps include a combination of known processes and novel processes similar to those described in connection with FIGS. 1A-1C that, for the sake of clarity, are not described in detail. Thus, the semiconductor device 200 as illustrated in FIG. 2 includes a semiconductor substrate 202, formed, for example, from silicon or another lattice mismatched material. A buffer layer 204 is deposited on the substrate 202, and may comprise a material such as gallium arsenide, germanium, indium phosphate, or gallium nitride. A first cladding layer 206 is deposited on the buffer layer 204, and may comprise a material such as gallium arsenide, aluminum gallium arsenide, indium phosphate, gallium nitride, or aluminum gallium nitride.

A quantum well emitter is formed on the first cladding layer 206 and comprises three layers: a first layer 208 of a wide bandgap material (e.g., aluminum arsenide or gallium nitride), a semiconductor layer 210 formed on the first layer of the wide bandgap material (and comprising, for example, gallium arsenide or indium gallium nitride), and a second layer 212 of the wide bandgap material formed on the semiconductor layer 210. Thus, the semiconductor layer 210 is effectively sandwiched between the first and second layers 208 and 212 of the wide bandgap material. Within the context of the present invention, a "wide bandgap material" is understood to be a material having a wider bandgap than the material that makes up the semiconductor layer 210.

A sacrificial layer 214 is deposited on the quantum well emitter, and in one example is more particularly is deposited on the second layer 212 of the wide bandgap material. The sacrificial layer 114 may include, for example, aluminum arsenide or aluminum gallium arsenide with a high aluminum concentration (e.g., a higher concentration of aluminum relative to the other elements). The sacrificial layer 114 may be deposited to a thickness in a range of approximately ten to one hundred nanometers. A second cladding layer 216 is deposited on the sacrificial layer 214. Unlike the second cladding layer 116 of FIGS. 1A-1C, which is similar in thickness to the corresponding first cladding layer 106 of FIGS. 1A-1C, the second cladding layer 216 of FIG. 2 is much thinner than its corresponding first cladding layer 206 (e.g., in a range of approximately ten to fifty nanometers). The thin second cladding layer 216 helps form a dielectric loaded surface plasmon polariton mode at the top metal interface, so that the semiconductor structure 200 can be fabricated smaller than the diffraction limited size (e.g., of the semiconductor structure 100).

As illustrated, lattice mismatch between some of the materials forming the semiconductor structure 200 cause the formation of one or more threading dislocations $2181$-$218n$ (hereinafter collectively referred to as "threading dislocations 218") in the semiconductor structure 200. These threading dislocations 218 can reduce the area in the semiconductor structure 200 that is suitable for the integration of optoelectronic devices.

As shown in FIG. 2, a portion of the semiconductor structure 200 is etched (e.g., via reactive ion etching or anisotropic wet chemical etching) to form a mesa. In particular, portions of the semiconductor structure (i.e., first cladding layer 206, first layer 208 of wide bandgap material, semiconductor layer 210, second layer 212 of wide bandgap material, sacrificial layer 214, and second cladding layer 216) are etched down to the buffer layer 204. In one example, the mesa that is etched in FIG. 2 is larger than the mesa that is etched in FIG. 1B. Since the active device aperture in this case will be confined by lateral oxidation, as described in further detail below, the width of the mesa illustrated in FIG. 2 can range from a few microns to tens of microns. A first metallic contact 220 is formed on the remaining portion of the second cladding layer 216, and a second metallic contact 222 is formed on a portion of the buffer layer 204.

Similar to the semiconductor structure 100 illustrated in FIG. 1C, the semiconductor structure 200 is next oxidized. In one example, oxidation of the semiconductor structure 200 comprises a lateral oxidation. Oxidation of the sacrificial layer 214 results in a majority of the sacrificial layer 214 forming an insulating material. For instance, if the sacrificial layer 214 contained aluminum, oxidation of the sacrificial layer 214 might result in the formation of aluminum oxide. However, a small aperture 224 remains in the oxidized sacrificial layer 214, and the size of the aperture 224 is controlled to be small enough to fit within a defect-free region of the semiconductor structure 200 (e.g., a region that is free of or does not intersect with any threading dislocations 218).

Thus, the aperture 224 confines the current and electron-photon conversion processes of the semiconductor structure 200 to a small, defect-free area. The aperture 224 may therefore form the optical output (i.e., light emitting area) of, for example, a nanocavity laser. This allows a reliable laser to be built upon a semiconductor structure 200 that includes defects that might otherwise inhibit operation of the laser.

Figure 3A:
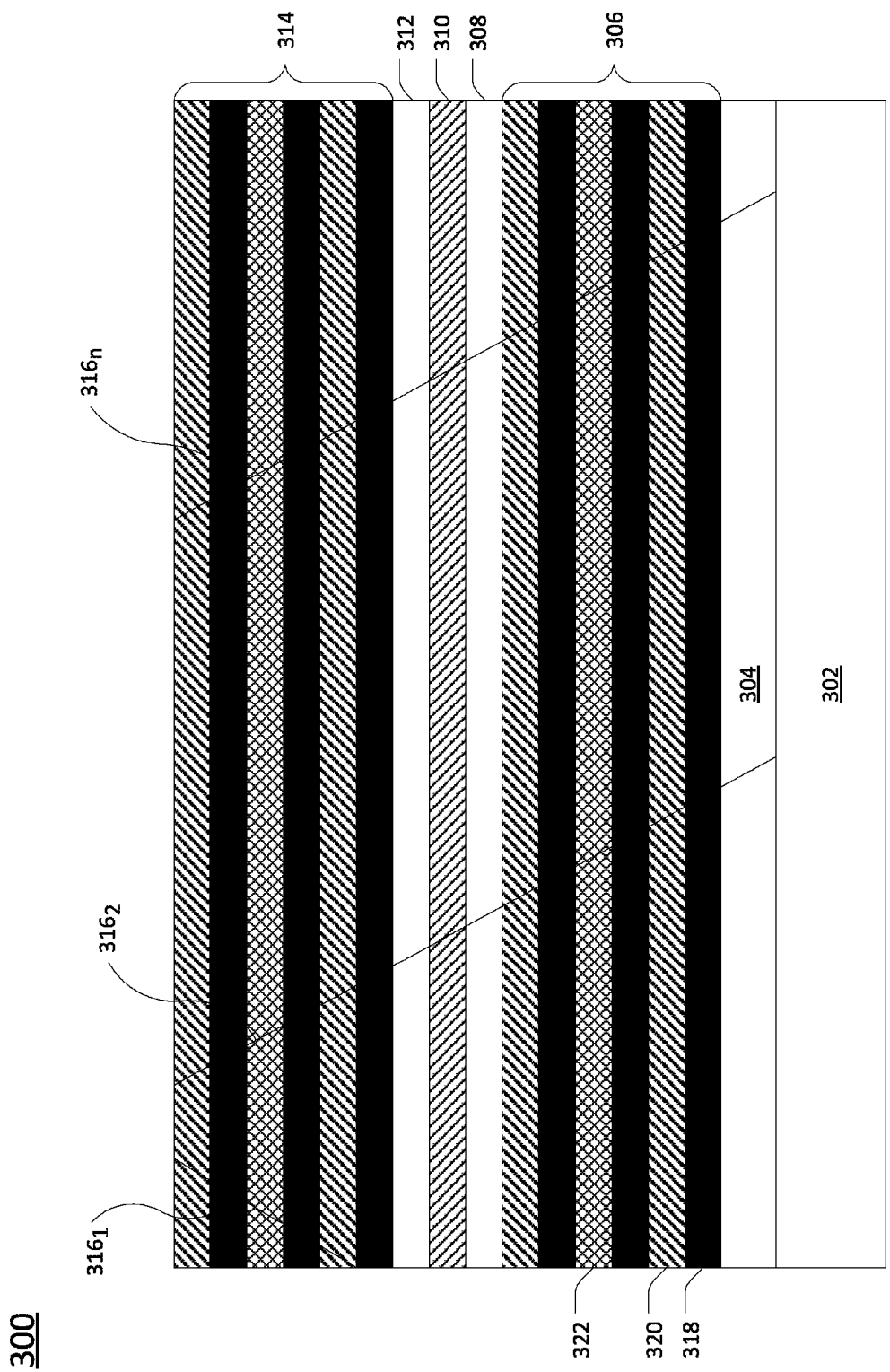
FIGS. 3A-3B illustrate cross sectional views of another semiconductor structure during various stages of another fabrication process performed according to examples of the present disclosure.
Figure 3B:
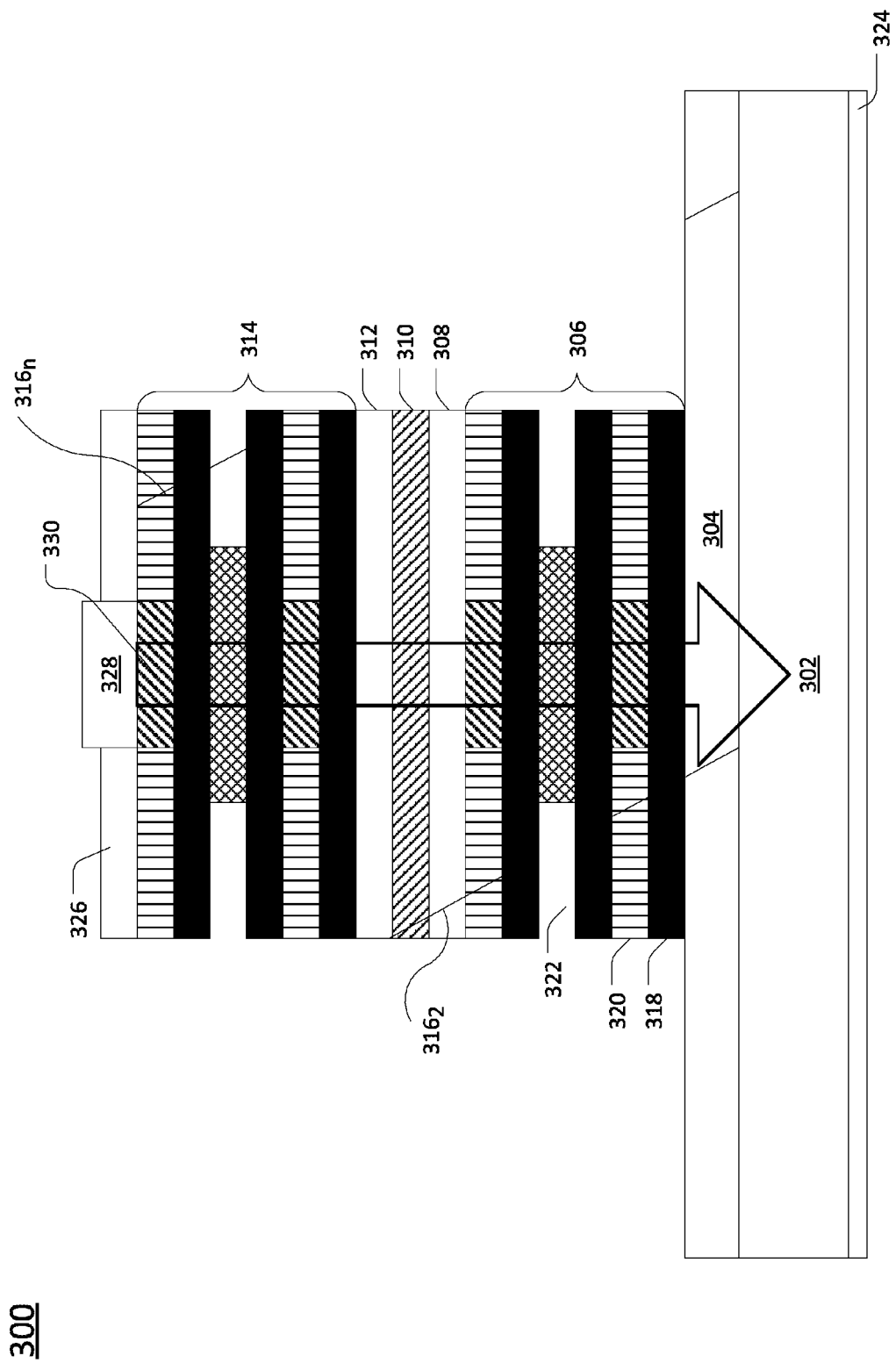

FIGS. 3A-3B illustrate cross sectional views of another semiconductor structure 300 during various stages of another fabrication process performed according to examples of the present disclosure. As such, when viewed in sequence, FIGS. 1A-1B also serve as a flow diagram for the fabrication process.

FIG. 3A in particular illustrates the semiconductor structure 300 during an intermediate step of the fabrication, process, i.e., after several fabrication steps have already been performed. These previous fabrication steps include known processes that are, for the sake of clarity, not described in detail. Thus, the semiconductor device 300 as illustrated in FIG. 3A includes a semiconductor substrate 302, formed, for example, from silicon or another lattice mismatched material. A buffer layer 304 is deposited on the substrate 302.

A first distributed Bragg reflector (DBR) layer 306 is formed on the buffer layer 304. The first DBR layer 306 actually comprises multiple layers of alternating materials with varying refractive indices. In the example illustrated in FIG. 3A, the first DBR layer 306 comprises alternating layers of a first material 318, a second material 320, and a third material 322. In one example, the first material 318 is a selective etching layer, the second material 320 is an oxidation layer, and the third material 322 is a non-oxidation, non-etching layer. For instance, the first DBR layer 306 can be composed of various compositions of aluminum gallium arsenide (e.g., $Al_xGa_{(1-x)}As$ or $Al_y(Ga_{(1-y)}As)$, aluminum arsenide, gallium arsenide, indium phosphide, indium gallium aluminum arsenide, and indium gallium arsenide phosphide.

A quantum well emitter is formed on the first DBR layer 306 and comprises three layers: a first layer 308 of a wide bandgap material (e.g., aluminum arsenide or gallium nitride), a semiconductor layer 310 formed on the first layer of the wide bandgap material (and comprising, for example, gallium arsenide or indium gallium nitride), and a second layer 312 of the wide bandgap material formed on the semiconductor layer 310. Thus, the semiconductor layer 310 is effectively sandwiched between the first and second layers 308 and 312 of the wide bandgap material. Within the context of the present invention, a "wide bandgap material" is understood to be a material having a wider bandgap than the material that makes up the semiconductor layer 310.

Second DBR layer 314 is formed on the quantum well emitter, and in one example is more particularly is formed on the second layer 312 of the wide bandgap material. The second DBR layer 314 may comprise alternating layers of the same materials (e.g., first material 318, second material 320, and third material 322) that make up the first DBR layer 306. For instance, the second DBR layer 314 can be composed of various compositions of aluminum gallium arsenide (e.g., $Al_xGa_{(1-x)}As$ or $Al_y(Ga_{(1-y)}As)$, aluminum arsenide, gallium arsenide, indium phosphate, indium gallium aluminum arsenide, and indium gallium arsenide phosphide.

As illustrated, lattice mismatch between some of the materials forming the semiconductor structure 300 cause the formation of one or more threading dislocations $316_1$-$316_n$ (hereinafter collectively referred to as "threading dislocations 316") in the semiconductor structure 300. These threading dislocations 316 can reduce the area in the semiconductor structure 300 that is suitable for the integration of optoelectronic devices.

FIG. 3B illustrates further steps of the fabrication process that mitigate the effect of the threading dislocations 316. In particular, as shown in FIG. 3B, a portion of the semiconductor structure 300 is etched (e.g., via reactive ion etching or anisotropic wet chemical etching) to form a mesa. In particular, portions of the semiconductor structure (i.e., first DBR layer 306, first layer 308 of wide bandgap material, semiconductor layer 310, second layer 312 of wide bandgap material, and second DBR layer 314) are etched down to the buffer layer 304. A first metallic contact 324 is formed beneath the substrate 302, and a second metallic contact 326 is formed on the second DBR layer 314. A transparent conductor 328 may be formed on the second metallic contact 326.

As further illustrated in FIG. 3B, the semiconductor structure 300 is next oxidized. Oxidation results in a majority of the second material 320 (i.e., oxidation layer) of the first and second DBR layers 306 and 314 forming an insulating material. For instance, if the second material 320 contained aluminum, oxidation of the second material 320 might result in the formation of aluminum oxide. However, a small aperture 330 remains in the oxidized second material 320, and the size of the aperture 330 is controlled to be small enough to fit within a defect-free region of the semiconductor structure 300 (e.g., a region that is free of or does not intersect with any threading dislocations 316). In one example, the aperture 330 has a diameter of one micrometer or less.

In addition, a selective etch is performed that results in the removal of portions of the first material 318 (i.e., selective etching layer) of the first and second DBR layers 306 and 314, as shown. The removal of this material creates air gaps in the mesa that facilitate the release of strains.

The third material 322 (i.e., non-oxidation, non-etching layer) remains largely intact through the oxidation and etching, as illustrated.

Thus, the aperture 330 formed by multilayer oxidation confines the current and electron-photon conversion processes of the semiconductor structure 300 to a small, defect-free area. The aperture 330 may therefore form the optical output (i.e., light emitting area) of, for example, a vertical cavity surface emitting laser (VCSEL) having a sub-micron aperture. This allows a reliable laser to be built upon a semiconductor structure 300 that includes defects that might otherwise inhibit operation of the laser.

Figure 4A:
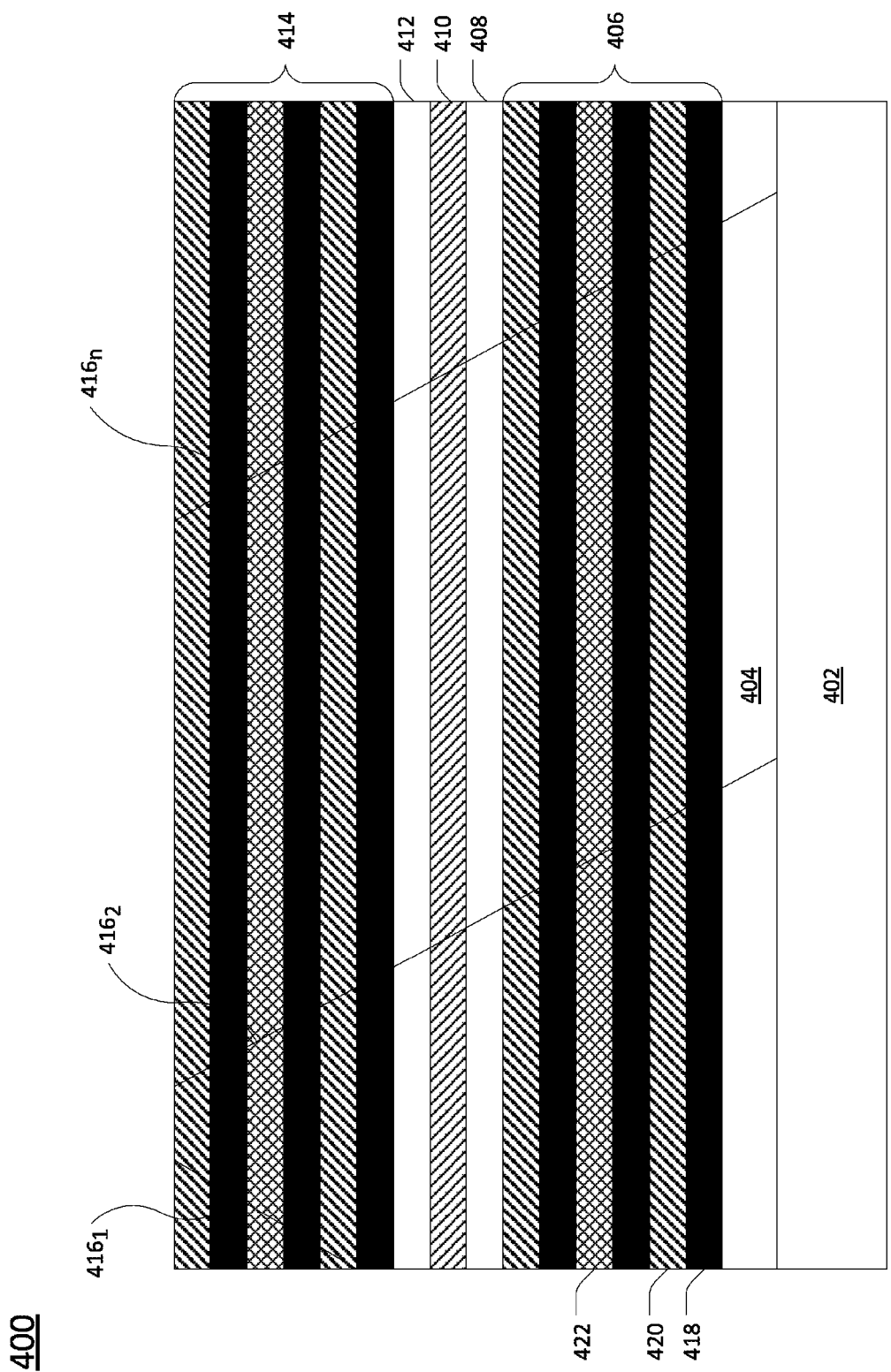
FIGS. 4A-4B illustrate cross sectional views of another semiconductor structure during various stages of another fabrication process performed according to examples of the present disclosure.
Figure 4B:
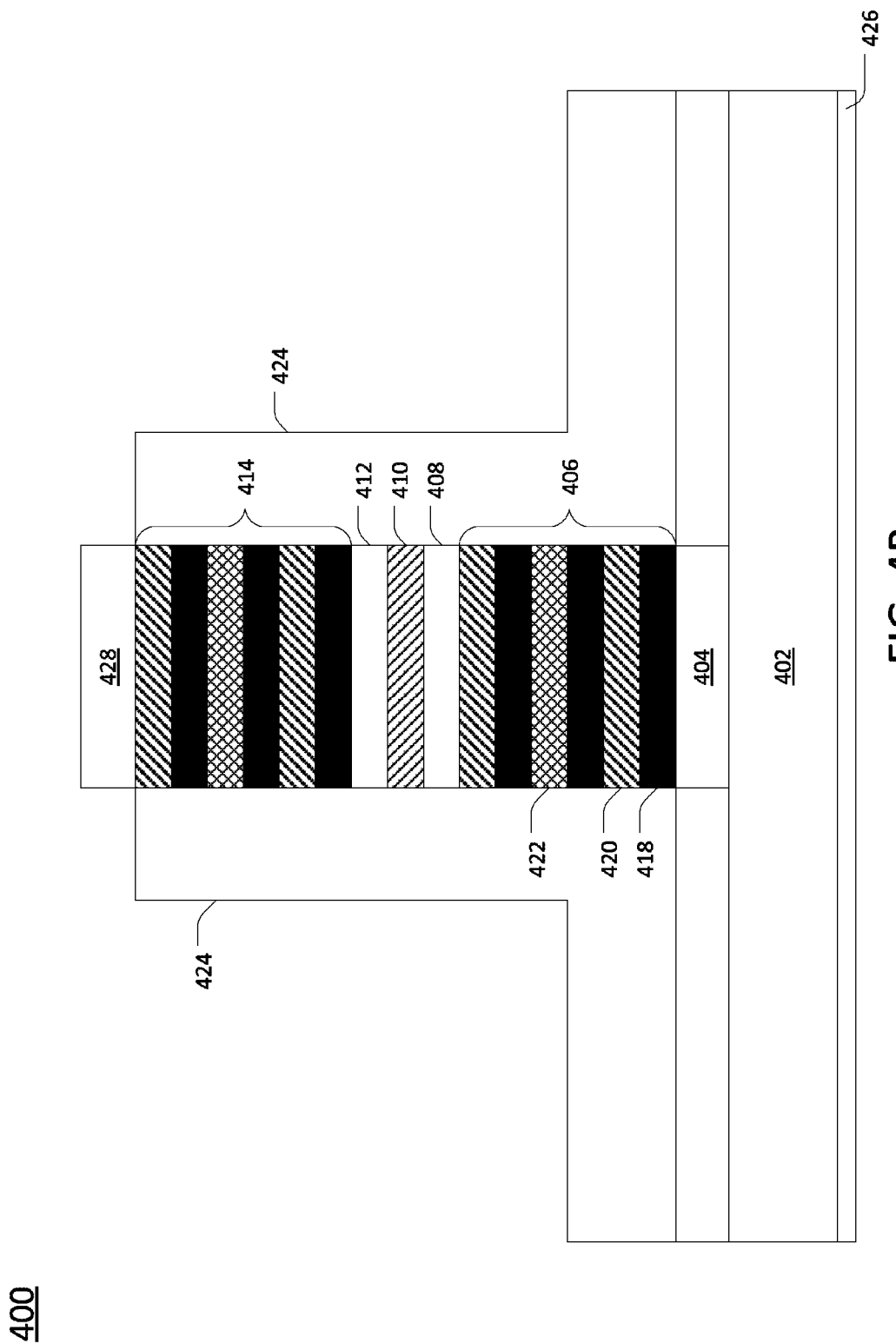

FIGS. 4A-4B illustrate cross sectional views of another semiconductor structure 400 during various stages of another fabrication process performed according to examples of the present disclosure. As such, when viewed in sequence, FIGS. 4A-4B also serve as a flow diagram for the fabrication process.

FIG. 4A in particular illustrates the semiconductor structure 400 during an intermediate step of the fabrication, process, i.e., after several fabrication steps have already been performed. These previous fabrication steps include known processes that are, for the sake of clarity, not described in detail. Thus, the semiconductor device 400 as illustrated in FIG. 4A includes a semiconductor substrate 402, formed, for example, from silicon or another lattice mismatched material. A buffer layer 404 is deposited on the substrate 402.

A first DBR layer 406 is formed on the buffer layer 404. The first DBR layer 406 actually comprises multiple layers of alternating materials with varying refractive indices. In the example illustrated in FIG. 4A, the first DBR layer 406 comprises alternating layers of a first material 418, a second material 420, and a third material 422. In one example, the first material 418 is a selective etching layer, the second material 420 is an oxidation layer, and the third material 422 is a non-oxidation, non-etching layer. For instance, the first DBR layer 406 can be composed of various compositions of aluminum gallium arsenide (e.g., $Al_xGa_{(1-x)}As$ or $Al_y(Ga_{(1-y)}As$), aluminum arsenide, gallium arsenide, indium phosphate, indium gallium aluminum arsenide, and indium gallium arsenide phosphide.

A quantum well emitter is formed on the first DBR layer 406 and comprises three layers: a first layer 408 of a wide bandgap material (e.g., aluminum arsenide or gallium nitride), a semiconductor layer 410 formed on the first layer of the wide bandgap material (and comprising, for example, gallium arsenide or indium gallium nitride), and a second layer 412 of the wide bandgap material formed on the semiconductor layer 410. Thus, the semiconductor layer 410 is effectively sandwiched between the first and second layers 408 and 412 of the wide bandgap material. Within the context of the present invention, a "wide bandgap material" is understood to be a material having a wider bandgap than the material that makes up the semiconductor layer 410.

Second DBR layer 414 is formed on the quantum well emitter, and in one example is more particularly is formed on the second layer 412 of the wide bandgap material. The second DBR layer 414 may comprise alternating layers of the same materials (e.g., first material 418, second material 420, and third material 422) that make up the first DBR layer 406. For instance, the second DBR layer 414 can be composed of various compositions of aluminum gallium arsenide (e.g., $Al_xGa_{(1-x)}As$ or $Al_y(Ga_{(1-y)}As$), aluminum arsenide, gallium arsenide, indium phosphate, indium gallium aluminum arsenide, and indium gallium arsenide phosphide.

As illustrated, lattice mismatch between some of the materials forming the semiconductor structure 400 cause the formation of one or more threading dislocations $416_1$-$416_n$ (hereinafter collectively referred to as "threading dislocations 416") in the semiconductor structure 400. These threading dislocations 416 can reduce the area in the semiconductor structure 400 that is suitable for the integration of optoelectronic devices.

FIG. 4B illustrates further steps of the fabrication process that mitigate the effect of the threading dislocations 416. In particular, as shown in FIG. 4B, a portion of the semiconductor structure 400 is etched (e.g., via reactive ion etching or anisotropic wet chemical etching) to form a mesa. In particular, portions of the semiconductor structure (i.e., first DBR layer 406, first layer 408 of wide bandgap material, semiconductor layer 410, second layer 412 of wide bandgap material, and second DBR layer 414) are etched down to the buffer layer 404. A first metallic contact 426 is formed beneath the substrate 402. A transparent conductor 428 may be formed on the mesa, on the second DBR layer 414.

The etching process that forms the mesa may result in the mesa having imperfect sidewalls. Thus, as further illustrated in FIG. 4B, surfaces of the mesa sidewalls are passivated by regrowing a Group III-V or a dielectric material on the buffer layer 404 and mesa sidewalls. For example, a regrowth layer 424 comprising gallium arsenide or indium phosphide may be regrown in order to passivate the imperfect mesa sidewalls. The resultant mesa, whose dimensions can be controlled to be small enough to fit within a defect-free region of the semiconductor structure 400 (e.g., a region that is free of or does not intersect with any threading dislocations 416), may have a diameter of one micrometer or less.

Thus, the mesa formed by etching and surface passivation confines the current and electron-photon conversion processes of the semiconductor structure 400 to a small, defect-free area. The mesa 400 may therefore form the optical output (i.e., light emitting area) of, for example, a VCSEL having a sub-micron aperture. This allows a reliable laser to be built upon a semiconductor structure 400 that includes defects that might otherwise inhibit operation of the laser.

Figure 5:
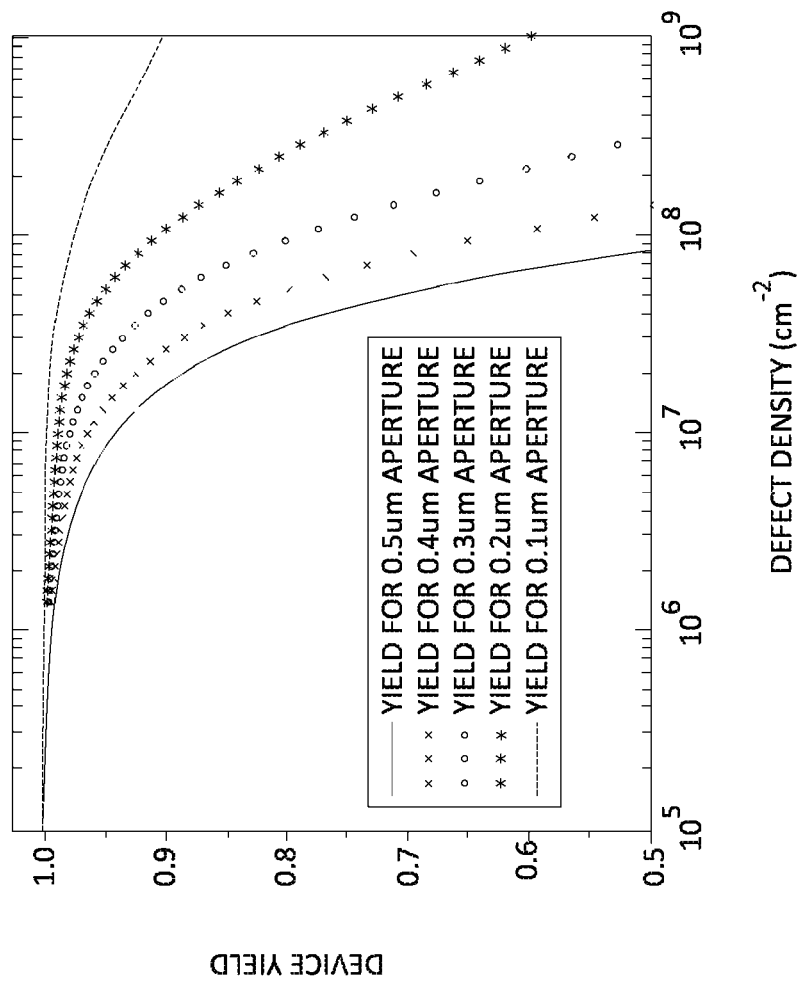
FIG. 5 is a graph illustrating advantages of the present disclosure.

FIG. 5 is a graph illustrating advantages of the present disclosure. In particular, FIG. 5 plots device yield versus defect density (in $cm^{-2}$) for apertures of a variety of sizes (i.e., 0.5 micrometer, 0.4, micrometer, 0.3 micrometer, 0.2 micrometer, and 0.1 micrometer). As illustrated, in many cases, there is a tradeoff between device yield and defect density. That is, as the defect density increases (e.g., more material defects are present in the semiconductor materials), the device yield decreases (e.g., fewer of the devices are useable). However, as FIG. 5 also illustrates, this tradeoff becomes less pronounced as the aperture size decreases. For instance, the decline in device yield for a defect density of approximately $10^9$ is far less dramatic for the 0.1 micrometer aperture than it is for the 0.5 micrometer aperture. Thus, examples of the present invention, which facilitate the formation of submicron apertures for optoelectronic device integration, can improve device yield and result in less waste.

Figure 6:
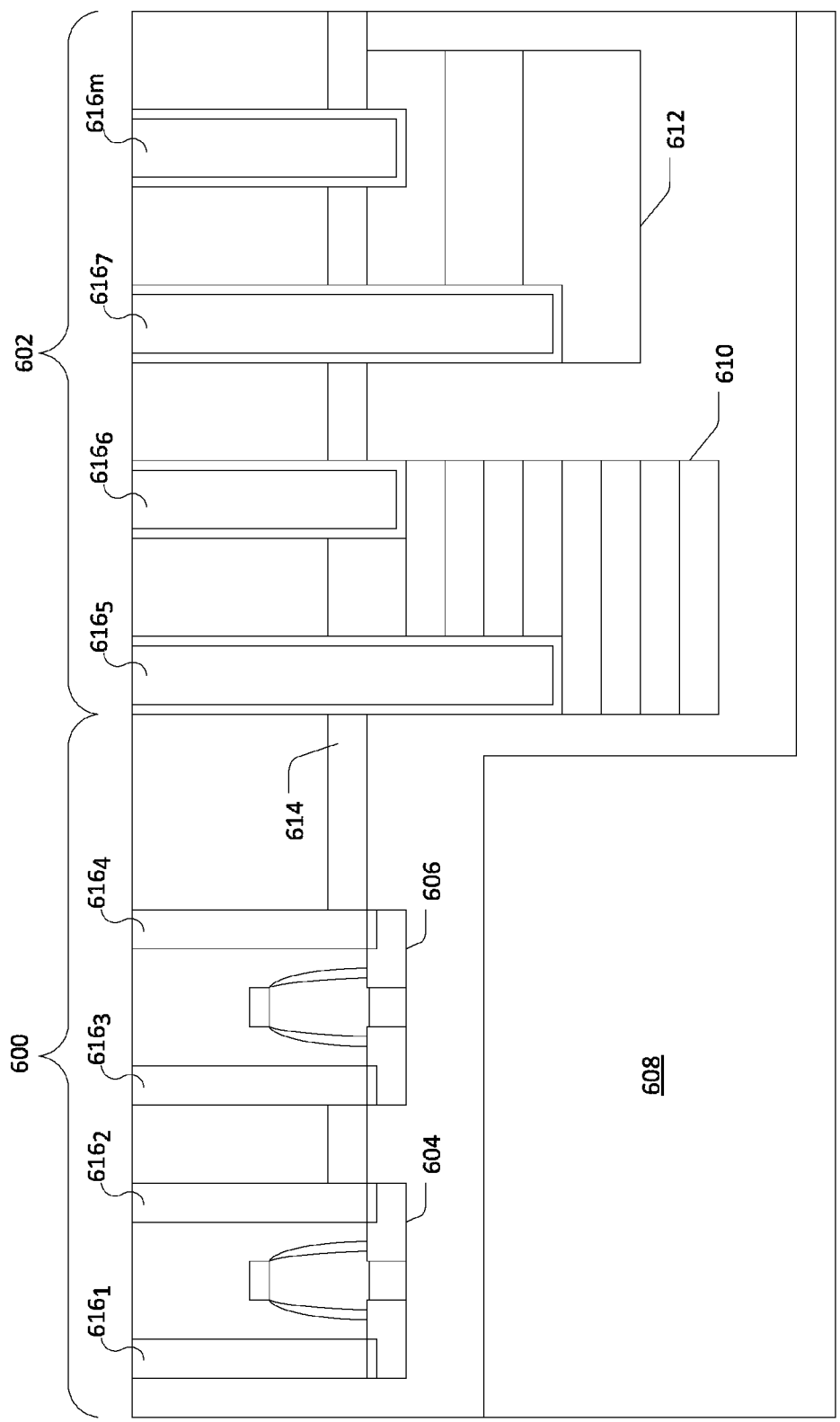
FIG. 6 illustrates an example system, according to examples of the present disclosure.

FIG. 6 illustrates an example system, according to examples of the present disclosure. In particular FIG. 6 illustrates system that includes a CMOS circuits region 600 integrated with a photonics region 602. The CMOS circuits region 600 may include a plurality of field effect transistors (FETs), including at least one p-type FET (pFET) 604 and at least one n-type FET (nFET) 606 fabricated upon a semiconductor substrate 608 (e.g., silicon). The photonics region 602 may comprise a laser 610, such as a VCSEL, and a detector 612. The various components of the CMOS circuits region 600 and the photonics region 602 may be coupled by and receive power by a series of conductive lines 614 and vias $616_1$-$616_m$ (hereinafter collectively referred to as "vias 616"). Various components of the photonics region 602, such as the laser 610 and/or detector 612, may be fabricated according to the techniques disclosed with references to the preceding Figures.

Although various embodiments which incorporate the teachings of the present invention have been shown and described in detail herein, those skilled in the art can readily devise many other varied embodiments that still incorporate these teachings.

What is claimed is:

1. A device comprising:
a layered semiconductor material having material defects formed therein, wherein the layered semiconductor material comprises:
a semiconductor substrate;
a buffer layer formed on the semiconductor substrate;
a first cladding layer formed on the buffer layer;
a quantum well emitter formed on the first cladding layer;
an oxidizing sacrificial layer formed directly on the quantum well emitter; and
a second cladding layer formed on the oxidizing sacrificial layer; and
an optoelectronic device formed in the layered semiconductor material, wherein the optoelectronic device includes an active region comprising an aperture formed through the layered semiconductor material, and wherein the aperture is formed in a manner that avoids intersection with the material defects.

2. The device of claim 1, wherein the material defects include threading dislocations resulting from a lattice mismatch between components of the layered semiconductor material.

3. The device of claim 1, wherein the optoelectronic device comprises a laser.

4. The device of claim 3, wherein the laser is an edge emitting laser.

5. The device of claim 1, wherein a current flowing through the optoelectronic device is confined to the active region.

6. A device comprising:
a complementary metal oxide semiconductor circuit region, comprising:
a semiconductor substrate;
a p-type field effect transistor fabricated upon the substrate; and
an n-type field effect transistor fabricated upon the substrate; and
a photonics region coupled to the complementary metal oxide semiconductor circuit region by a series of conductive lines and vias, comprising:
a layered semiconductor material having material defects formed therein; and
an optoelectronic device formed in the layered semiconductor material, wherein the optoelectronic device includes an active region comprising an aperture formed through the layered semiconductor material, and wherein the aperture is formed in a manner that avoids intersection with the material defects.

7. A method comprising:
providing a layered semiconductor material, wherein the layered the semiconductor material includes material defects forms therein, wherein the layered semiconductor material comprises:
a semiconductor substrate;
a buffer layer formed on the semiconductor substrate;
a first cladding layer formed on the buffer layer;
a quantum well emitter formed on the first cladding layer;
an oxidizing sacrificial layer formed directly on the quantum well emitter; and
a second cladding layer formed on the oxidizing sacrificial layer;
forming an aperture in the layered semiconductor material, wherein the aperture avoids intersection with the material defects; and
forming an active region of an optoelectronic device in the aperture.

8. The method of claim 7, wherein the material defects include threading dislocations resulting from a lattice mismatch between components of the layered semiconductor material.

9. The method of claim 7, wherein the optoelectronic device comprises a laser.

10. The method of claim 9, wherein the laser is an edge emitting laser.

11. The method of claim 7, wherein a current flowing through the optoelectronic device is confined to the active region.

12. The method of claim 1, wherein the forming the aperture comprises:
etching the second cladding layer, the oxidizing sacrificial layer, the quantum well emitter, and the first cladding layer down to the buffer layer to form a mesa; and
oxidizing the mesa until a first portion of the oxidizing sacrificial layer oxidizes into an insulating material and a second portion of the oxidizing sacrificial layer remains unoxidized and forms the aperture.

13. The device of claim 1, wherein the quantum well emitter comprises:
a first layer of a wide bandgap material formed on the first cladding layer;
a layer of a semiconductor material formed on the first layer of the wide bandgap material; and
a second layer of the wide bandgap material formed on the layer of the semiconductor material.

* * * * *